(12) United States Patent
Zhou

(10) Patent No.: US 11,011,640 B2
(45) Date of Patent: May 18, 2021

(54) FIN FIELD EFFECT TRANSISTOR

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/722,316

(22) Filed: Dec. 20, 2019

(65) Prior Publication Data
US 2020/0127133 A1   Apr. 23, 2020

Related U.S. Application Data

(62) Division of application No. 16/039,833, filed on Jul. 19, 2018, now Pat. No. 10,553,722.

(30) Foreign Application Priority Data

Jul. 20, 2017  (CN) .......................... 201710595510.1

(51) Int. Cl.
| | | |
|---|---|---|
| *H01L 29/78* | (2006.01) | |
| *H01L 29/06* | (2006.01) | |
| *H01L 21/762* | (2006.01) | |
| *H01L 21/8234* | (2006.01) | |
| *H01L 29/66* | (2006.01) | |

(52) U.S. Cl.
CPC ...... *H01L 29/785* (2013.01); *H01L 21/76224* (2013.01); *H01L 21/823431* (2013.01); *H01L 29/0642* (2013.01); *H01L 29/66795* (2013.01)

(58) Field of Classification Search
CPC ............... H01L 29/785; H01L 29/0642; H01L 29/66795; H01L 21/76224; H01L 21/823431
USPC ........................................................ 257/401
See application file for complete search history.

(56) References Cited

U.S. PATENT DOCUMENTS

| | | | |
|---|---|---|---|
| 9,653,551 B2 * | 5/2017 | Oh | ................. H01L 21/823821 |
| 2016/0181366 A1 * | 6/2016 | Oh | ..................... H01L 29/1041 |
| | | | 257/77 |
| 2017/0271499 A1 | 9/2017 | Lee | |

FOREIGN PATENT DOCUMENTS

| | | |
|---|---|---|
| CN | 104425275 A | 3/2015 |
| CN | 106409789 A | 2/2017 |
| JP | 2014063929 A | 4/2014 |

* cited by examiner

*Primary Examiner* — Tu-Tu V Ho
(74) *Attorney, Agent, or Firm* — Anova Law Group, PLLC

(57) ABSTRACT

A fin field effect transistor is provided. The FinFET device includes a base substrate; an isolation layer on the base substrate; first fins in the isolation layer and on the base substrate. The first fins is made of a material having a thermal conductivity greater than a material of the base substrate.

19 Claims, 5 Drawing Sheets

FIN FIELD EFFECT TRANSISTOR

CROSS-REFERENCES TO RELATED APPLICATION

This application is a divisional of U.S. patent application Ser. No. 16/039,833, filed on Jul. 19, 2018, which claims the priority of Chinese Patent Application No. 201710595510.1, filed on Jul. 20, 2017, the content of which is incorporated by reference in its entirety.

TECHNICAL FIELD

The present disclosure generally relates to the field of semiconductor technologies and, more particularly, relates to a fin field effect transistor (FinFET) and its fabrication method.

BACKGROUND

As semiconductor technologies develop, semiconductor devices are developed toward a direction with a higher device density and a higher integration level. A transistor is one of the most fundamental devices and is widely used. With developments of the semiconductor technologies, a length of a gate in a planar transistor decreases. Correspondingly, a controlling ability of a conventional planar transistor on channel currents becomes weaker, causing short channel effects and serious leakage current problems. The semiconductor device has a poor performance.

To better alleviate the short channel effects and suppress the leakage currents, fin field effect transistors (FinFETs) are widely used. A FinFET is a multi-gate device, and usually includes: fins on a semiconductor substrate; a dielectric layer on the semiconductor substrate covering a portion of sidewalls of the fins and with a top surface lower than top surfaces of the fins; gate structures on the top surface of the dielectric layer, on tops of the fins, and on the sidewalls of the fins; and sources and drains in the fins on two sides of the gate structures.

However, as the device density increases and critical dimensions decrease, it is more difficulty for forming the FinFETs, and the formed FinFETs have poor performances and low reliabilities.

SUMMARY

One aspect of the present disclosure provides a fabrication method of a fin field effect transistor (FinFET). The method includes: providing a base substrate, initial first fins on the base substrate, and an initial isolation layer covering a portion of sidewalls of the initial first fins; etching the initial first fins using the initial isolation layer as a mask, to form first grooves in the initial isolation layer; forming first fins by forming a filling material film in the first grooves; and etching back the initial isolation layer to form an isolation layer covering a portion of sidewalls of the first fins. A material of the first fins has a thermal conductivity greater than a thermal conductivity of a material in the base substrate.

Another aspect of the present disclosure provides a fin field effect transistor (FinFET). The FinFET includes: a base substrate; an isolation layer on the base substrate; and first fins in the isolation layer and on the base substrate. The first fins is made of a material with a thermal conductivity greater than a material of the base substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
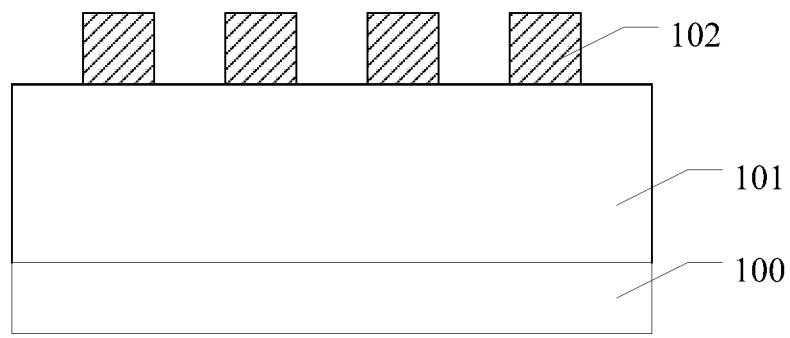
FIG. 1 to FIG. 3 illustrate semiconductor structures corresponding to certain stages for forming a fin field-effect transistor (FinFET) device.
Figure 2:
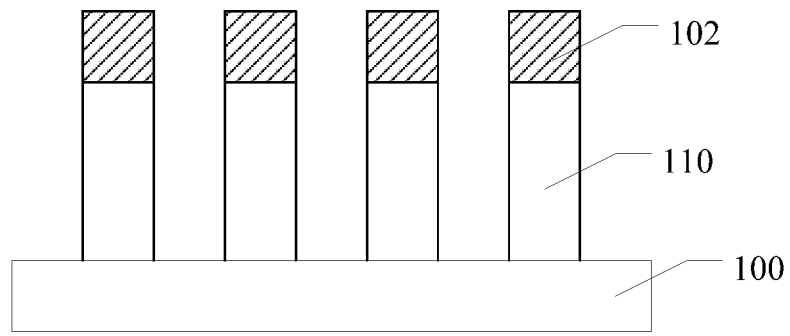
Figure 3:
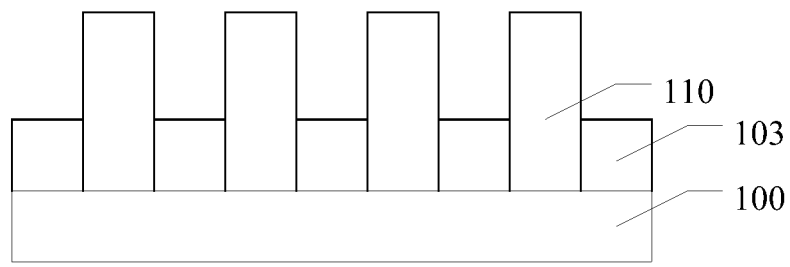

FIG. 1 to FIG. 3 illustrate semiconductor structures corresponding to certain stages for forming a fin field effect transistor (FinFET).

Referring to FIG. 1, a base substrate 100 may be provided. A semiconductor film 101 may be formed on the base substrate 100. A patterned layer 102 may be formed on the semiconductor film 101, to define shapes and positions of subsequently formed first fins.

Referring to FIG. 2, the semiconductor film 101 may be etched by using the patterned layer 102 as a mask, to expose a portion of a top surface of the base substrate 100 and to form the first fins 110.

Referring to FIG. 3, the patterned layer 102 (shown in FIG. 2) may be removed and an isolation layer 103 may be formed on the base substrate 100 to cover a portion of sidewalls of the first fins 110.

The isolation layer 103 may be formed by: form an isolation film on the base substrate to cover a top surface of the first fins 110 and sidewalls of the first fins 110; planarizing the isolation film to expose the first fins; and etching back the isolation films.

As the integration levels of the semiconductor devices increase, the isolation layer 103 blocks thermal conductions, especially under high electrical voltage and high current conditions. Self-heating effects (SHE) become more serious, and have a large influence on the reliabilities and the lifetimes of the transistors. Cross-section areas of the first fins 110 are limited by the materials and designed layouts, heats in the sources and drains cannot be efficiently transmitted to the base substrate 100. The electrical reliabilities are seriously affected.

The present disclosure provides a FinFET and a fabricating method for the FinFET. The method may include: etching initial first fins by using an initial isolation layer as a mask to form first grooves in the initial isolation layer; and forming first fins in the first grooves. A material of the first fins may have a thermal conductivity greater than a thermal conductivity of a material in the base substrate.

Figure 10:
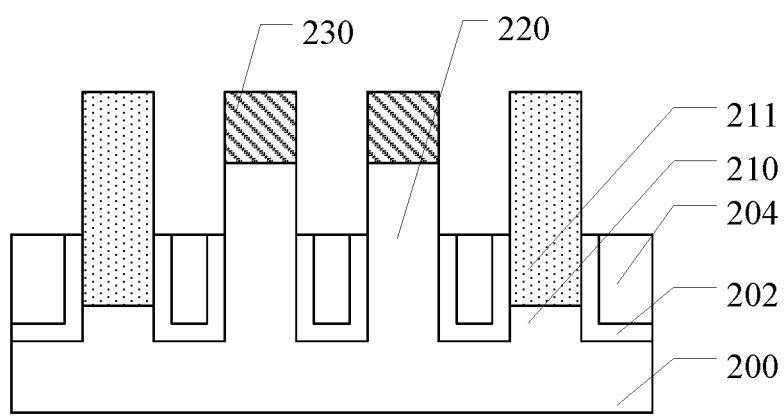
Figure 11:
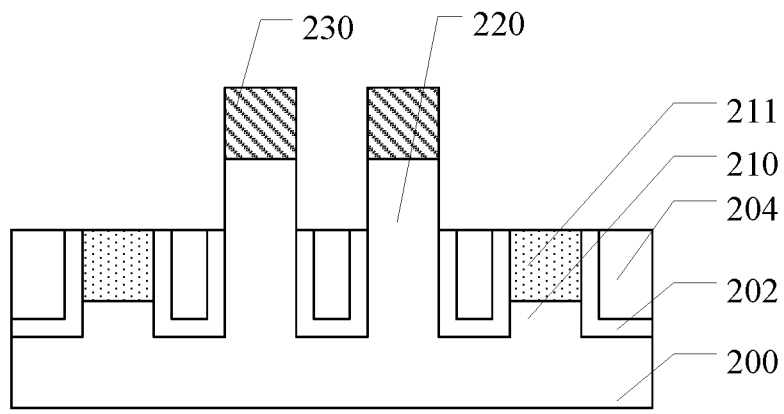
Figure 12:
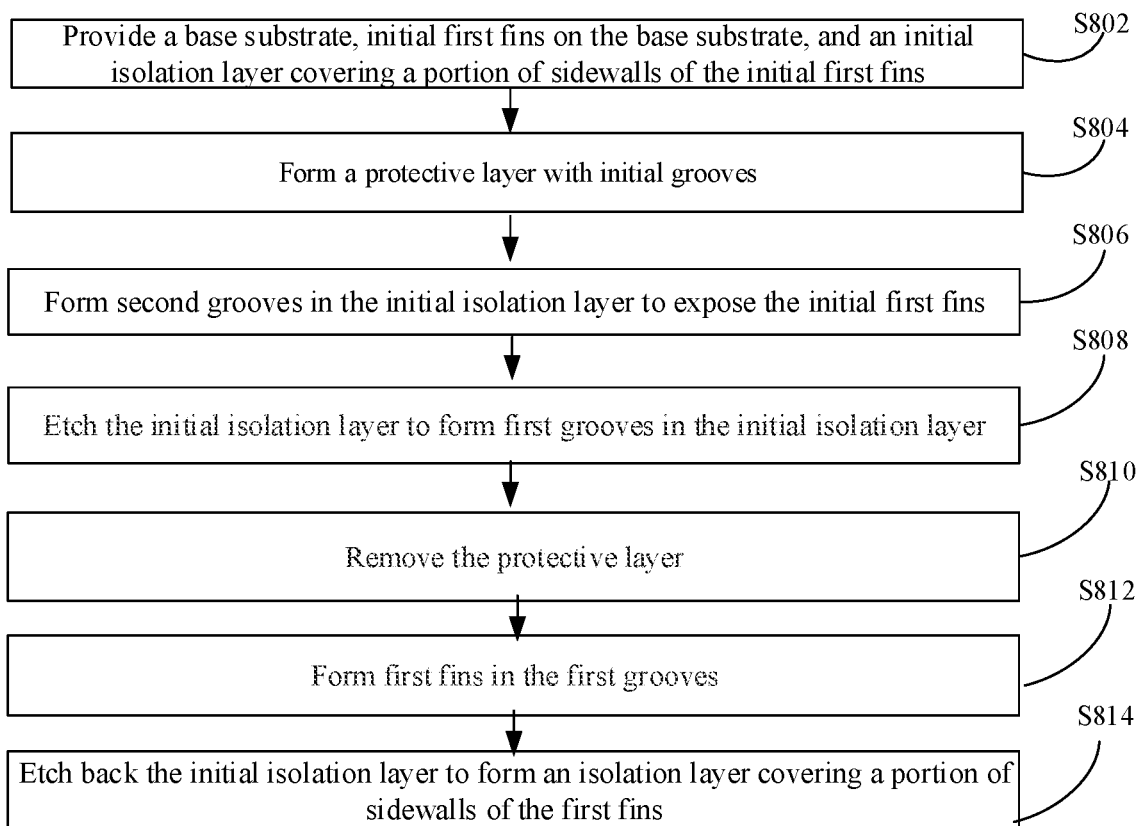
FIG. 12 illustrates an exemplary method for forming a FinFET device according to various disclosed embodiments of the present disclosure.

FIGS. 4-11 illustrate semiconductor structures corresponding to certain stages for forming an exemplary FinFET according to various disclosed embodiments of the present disclosure; and FIG. 12 illustrates an exemplary method for forming a FinFET according to various disclosed embodiments of the present disclosure.

Figure 4:
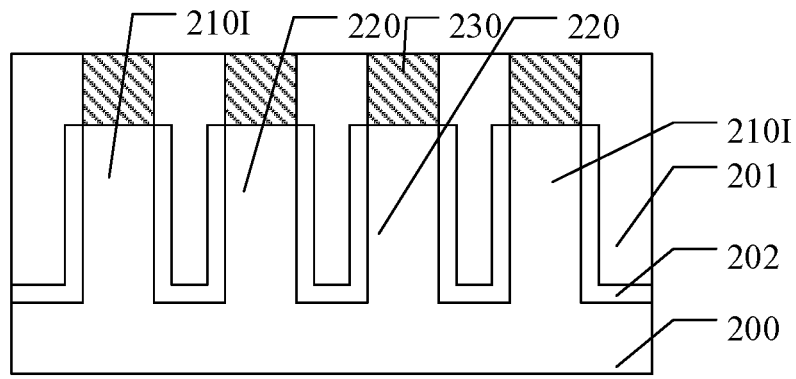
FIGS. 4-11 illustrate semiconductor structures corresponding to certain stages for forming an exemplary FinFET according to various disclosed embodiments of the present disclosure.

Referring to FIG. 4, a base substrate 200 may be provided (e.g., in Step S802 in FIG. 12). A plurality of initial first fins 210I may be formed on the base substrate 200, and an initial isolation layer 201 may be formed to cover a portion of sidewalls of each initial first fin 210.

A fin structure may be further formed on the base substrate 200. The fin structure may include at least one second fin 220. The initial first fins 210I may be located at one side or two sides of the fin structure.

In one embodiment, the fin structure may include a plurality of the second fins 220, and the initial first fins 210I may be located at least at one side of the fin structure. A distance from the sidewalls of each initial first fin 210I to the sidewalls of an adjacent second fin 220 may be a first distance, and a distance between the sidewalls of two adjacent second fins 220 may be a second distance. The first distance may be equal to the second distance.

The base substrate 200 may be made of single crystal silicon, polycrystal silicon, amorphous silicon, germanium, SiGe, GaAs, or any other suitable semiconductor materials. The base substrate 200 may be a bulk material or a composite structure including a silicon on an insulator. In one embodiment, the base substrate 200 may be made of silicon.

In one embodiment, the initial first fins 210I and the second fins 220 may be formed by patterning the base substrate 200. In other embodiments, the initial first fins 210I and the second fins 220 may be formed by: forming a fin material layer on the base substrate 200; and then patterning the fin material layer.

A bottom width of the initial first fins 210I and a top width of the initial first fins 210I may be a size of the initial first fins 210I along a direction parallel to the surface of the base substrate 200 and perpendicular to an extending direction of the initial first fins 210I.

In one embodiment, the bottom width of the initial first fins 210I may be larger than the top width of the initial first fins 210I because of the etching process.

In other embodiments, the bottom width of the initial first fins 210I may be equal to the top width of the initial first fins 210I and the second fins 220. The bottom width of the second fins 220 may be equal to the top width of the initial first fins 210I and the second fins 220.

In one embodiment, a mask structure 230 may be formed on the initial first fins 210I and on the second fins 220.

The mask structure 230 may be used to define a stop position of a planarizing process, and may protect tops of the initial first fins 210I and the second fins 220, when subsequently forming the initial isolation layer 201.

The mask structure 230 may be made of a material including SiN, SiNO, SiCO, SiCN, and/or SiNCO.

In one embodiment, the mask structure 230 may have a single-layer structure.

In other embodiments, the mask structure 230 may have a multilayer structure. The mask structure 230 may include a first mask layer on the top surfaces of the initial first fins 210I and on the top surfaces of the second fins 220, and a second mask layer on a top surface of the first mask layer. The first mask layer may be made of $SiO_2$ and the second mask layer may be made of SiN. The first mask layer may reduce strains between the second mask layer and the top surfaces of the initial first fins 210I and the second fins 220.

In one embodiment, the initial first fins 210I, the second fins 220 and the mask structure 230 may be formed by: forming a fin material layer on the base substrate 200; forming a mask material layer on a top surface of the fin material layer; and patterning the mask material layer and the fin material layer, to form the initial first fins 210I, the second fins 220 and the mask structure 230. The initial first fins 210I and the second fins 220 may correspond to the fin material layer. The mask structure 230 may correspond to the mask material layer.

The initial isolation layer 201 may be formed by: forming an isolation film on the base substrate 200, to cover the sidewalls of the initial first fins 210I, the sidewalls of the second fins 220, the sidewalls of the mask structure 230, and the top surface of the mask structure 230; and planarizing the isolation film to expose the top surface of the mask structure 230.

Optionally and additionally, a liner oxide layer 202 may be formed between the sidewalls of the initial first fins 210I and the initial isolation layer 201, and between the sidewalls of the second fins 220 and the initial isolation layer 201.

In one embodiment, the linear oxide layer 202 may be further formed between the base substrate 200 and the initial isolation layer 201.

The liner oxide layer 202 may increase interface bonding strengths between the initial first fins 210I and the initial isolation layer 201, and between the second fins 220 and the initial isolation layer 201.

The liner oxide layer 202 may be formed by a deposition process or an oxidization process.

In one embodiment, a protective layer may be formed on the initial isolation layer and on the second fins. The protective layer may include openings and the initial first fins may be under the openings. The initial first fins may be etched by using the initial isolation layer and the protective layer as a mask, to form the first grooves in the initial isolation layer.

In one embodiment, second grooves may be formed in the initial isolation layer before forming the first grooves. The second grooves may expose the initial first fins. The second grooves may be formed by etching the mask structure on the tops of the initial first fins by using the initial isolation layer and the protective layer as a mask to expose the top surfaces of the initial first fins.

Figure 5:
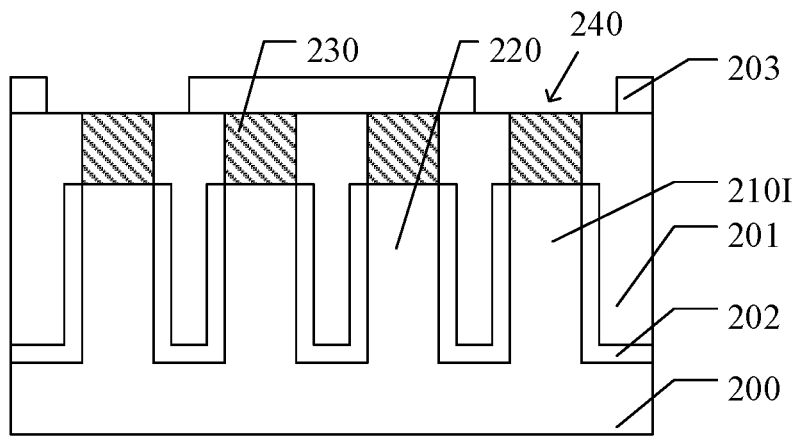

Referring to FIG. 5, a protective layer 203 may be formed on the initial isolation layer 201 and on the second fins 220 (e.g., in Step S804 in FIG. 12). The protective layer 203 may include openings 240. The initial first fins 210I may be under the openings 240.

The protective layer 203 may protect the second fins 220 when etching the initial first fins 210I.

In some embodiments, the protective layer 203 may be made of a material including a macromolecular polymer. The macromolecular polymer may include a photoresist. The photoresist may include a positive photoresist and/or a negative photoresist. In other embodiments, the photoresist may include an I-line photoresist, a G-line photoresist, and/or an H-line photoresist.

In one embodiment when the protective layer 203 is made of a photoresist, the protective layer 203 and the openings 240 may be formed by: forming a photoresist film on the initial isolation layer 201 and on the mask structure 230; defining shapes and positions of the openings 240 by an exposure/development process; and forming the protective layer 203 on the initial isolation layer 201 and on the second fins 220.

In another embodiment, to alleviate a shrinkage of the photoresist film, the photoresist film may be soft-baked after forming the photoresist film. After soft-baking, a photoresist-fixing treatment may be applied on the photoresist film to ensure that critical dimensions of the protective layer 203 meet designed specifications.

Figure 6:
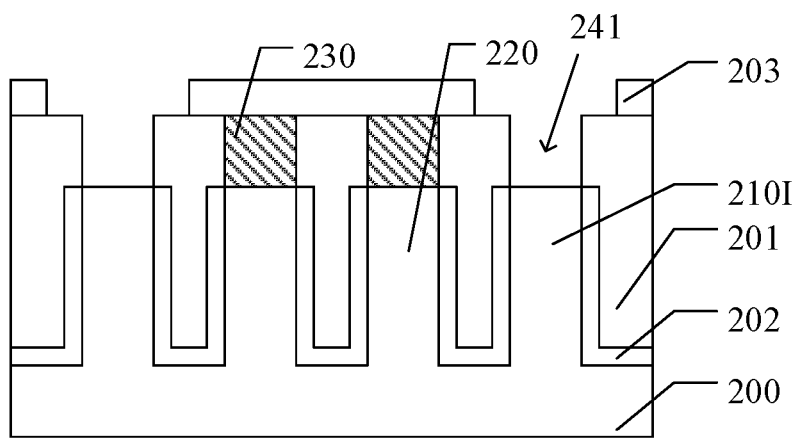

Referring to FIG. 6, second grooves 241 may be formed in the initial isolation layer 201 to expose the initial first fins 210I (e.g., in Step S806 in FIG. 12).

The second grooves 241 may be formed by etching the mask structure 230 on the top surfaces of the initial first fins 210I by using the initial isolation layer 201 and the protective layer 203 as a mask to expose the top surfaces of the initial first fins 210I.

In one embodiment, the second grooves 241 may be under the openings 240. The second grooves 241 may be formed by an etching process. In one embodiment, the second grooves 241 may be formed by an anisotropic dry etching process in an etching environment based on fluorine. The etching process may use an etching gas including $C_4F_8$, $C_4F_6$, $C_5F_8$, $C_3H_8$, or a combination thereof, an etching power of about 300 W to 400 W, and an etching pressure of about 10 mtorr to about 30 mtorr.

When forming the second grooves 241 by the anisotropic dry etching process, the etching gas may have a certain impact on the protective layer 203. A hard crust may be formed on the surface of the protective layer because of the impact of the etching gas. The hard crust may have a dense structure and may affect removal results of the protective layer 203.

Figure 7:
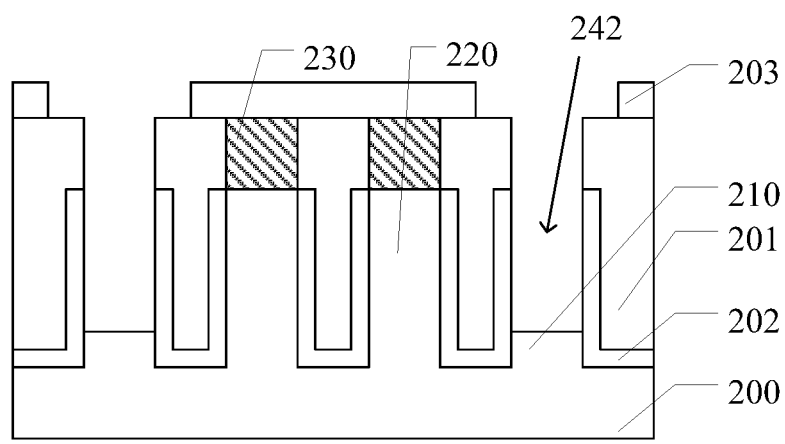

Referring to FIG. 7, the initial first fins 210I may be etched by using the initial isolation layer 201 and the protective layer 203 as a mask, to form first grooves 242 in the initial isolation layer 201 (e.g., in Step S808 in FIG. 12).

In one embodiment, the first grooves 242 may be under the second grooves 241, and the first grooves 242 may expose a portion of the linear oxide layer 202.

Using the initial isolation layer 201 as the mask may reduce damages on sidewalls of the first grooves 242, reduce damages on sidewalls of the subsequent first fins, and improve profiles of the sidewalls of the subsequent first fins. A quality of channels in the formed FinFET may be improved, and the leakage currents may be reduced, to improve the performance and the reliability of the semiconductor device.

The first grooves 242 may be formed by an etching process. In one embodiment, the first grooves may have bottom surfaces higher than the top surface of the base substrate. In another embodiment, the first grooves may have the bottom surfaces coplanar the top surface of the base substrate.

In other embodiments, after etching the initial first fins 210I, the base substrate 200 may be further etched. The first grooves 242 may penetrate through the initial isolation layer 201 and may have the bottom surfaces lower than the top surface of the base substrate 200. Contacting areas between the first fins to be formed in the first grooves and the base substrate may be adjusted by controlling an etching depth in the base substrate, to improve thermal conductions and the performance of the semiconductor devices.

A perpendicular distance from the bottom surfaces of the first grooves 242 to the top surface of the base substrate 200 may be about 200 Å to about 300 Å. When this perpendicular distance is too large, the first fins to be formed in the first grooves 242 may not have enough height. The designed cooling requirement may not be matched and the self-heating effects may not be alleviated. When this perpendicular distance is too small, the process may be wasted.

In one embodiment, the remaining initial first fins 210 may be under the first grooves 242, and the first grooves 242 may have the bottom surfaces higher than the top surface of the base substrate.

In other embodiments, the initial first fins 210I and the fin structure may be etched by using the initial isolation layer 201 as a mask, to form the first grooves 242 in the initial isolation layer 201.

When forming the first grooves 242 by a dry etching process, the etching gas may have a certain impact on the protective layer 203. A hard crust may form on the surface of the protective layer because of the impact of the etching gas. The hard crust may have a dense structure and may affect removal results of the protective layer 203.

In one embodiment, the protective layer may be removed after forming the first grooves.

Figure 8:
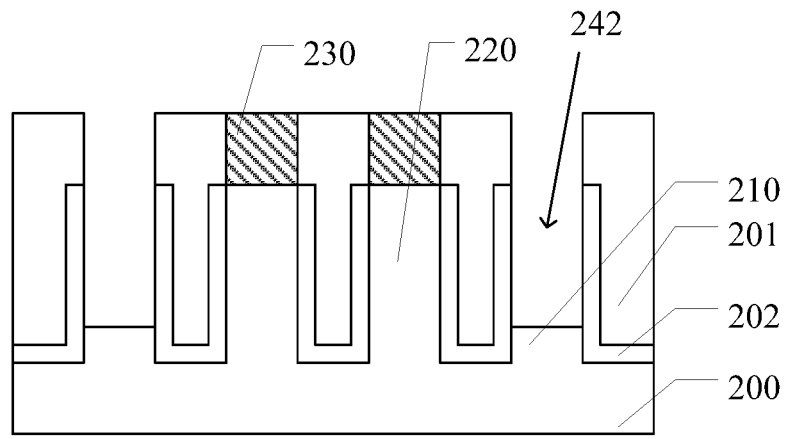

Referring to FIG. 8, the protective layer 203 may be removed after forming the first grooves 242 (e.g., in Step S810 in FIG. 12).

The protective layer 203 may be removed by an ashing process, a wet etching process, or a combination thereof.

In one embodiment, the protective layer 203 may be ashed first by a plasma including oxygen ions, and then removed by the wet etching process. The wet etching process may use a mixed solution including HF and $H_2SO_4$ to remove residuals containing carbon produced by the ashing process, to ensure results of removing the protective layer 203. The first grooves 242 may be cleaned simultaneously, to prevent the first fins from being contaminated by impurities. The cooling effect and the performance of the transistors may be improved.

In another embodiment, the ashing process may use a process gas including $N_2$, Hz, or a combination thereof, to remove the hard crust on the surface of the protective layer 203.

In another embodiment, a first ashing process may be applied to the protective layer 203. After the first ashing process, a second ashing process may be applied to the protective layer 203. The first ashing process may have a plasma ashing rate greater than a plasma ashing rate of the second ashing process, to remove the protective layer 203 more quickly. The second ashing process may have fewer reaction products, to ensure a cleanliness of the first grooves 242.

In one embodiment, before the wet etching process, an ultraviolet radiation may be applied to the protective layer 203. The ultraviolet radiation may use an ultraviolet light with a wavelength of about 254 nm to about 300 nm and with a luminous energy density of about 25 mW/cm$^2$ to about 28 mW/cm$^2$. The ultraviolet radiation may modify the hard crust on the surface of the protective layer 203. The modified hard crust can be removed by the wet etching process, to prevent damages to the mask structure 230 and damages to the initial isolation layer 201 in the ashing process. Defects and charge contaminations in the first grooves 242 may be alleviated.

In other embodiments, the protective layer 203 may be removed after subsequently forming the first fins. Contaminations on the fins may be avoided and the performance of the transistors may be improved.

Figure 9:
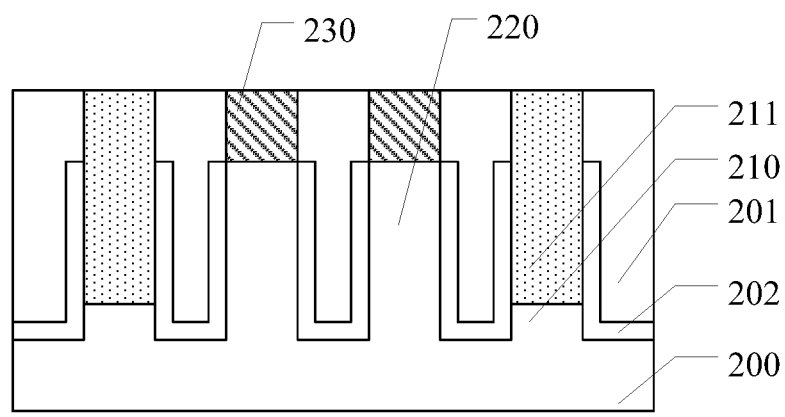

Referring to FIG. 9, the first fins 211 may be formed in the first grooves 242 (e.g., in Step S812 in FIG. 12). A material of the first fins 211 may have a thermal conductivity greater than a thermal conductivity of a material in the base substrate 200.

In one embodiment, the first fins 211 may be formed by filling each first grooves 242 with a filling material film.

A material of the filling material film may have a thermal conductivity greater than the thermal conductivity of the material in the base substrate 200. When the FinFET works under a voltage, the first fins 211 may contact the base substrate 200 and the subsequent isolation layer, to improve the thermal conduction between the base substrate 200 and the isolation layer. The self-heating effect in the transistor may be alleviated and the performance of the semiconductor device may be improved.

The filling material film may be formed by an epitaxial growth process, a deposition process, or a combination thereof. In one embodiment, the process for forming the first fins 211 may further include polishing the filling material film by a chemical mechanical polishing process to expose the top surface of the initial isolation layer 201. The filling material film may be made of a material including AlN, SiC, and/or graphene.

In one embodiment, the initial first fins 210I may be formed by patterning the base substrate 200 (for example, a Si substrate), and the thermal conductivity of the initial first fins 210I and the thermal conductivity of the base substrate 200 may be about 150 W/mK. The first fins 211 may be made of SiC with a thermal conductivity of about 490 W/mK or graphene with a thermal conductivity of about 5300 W/mK. The material of the first fins 211 may have the thermal conductivity greater than the thermal conductivity of the material in the base substrate 200. A thermal accumulation in the transistor subject to a voltage may be reduced, and the self-heating effect may be alleviated or eliminated.

In one embodiment, the filling material film may be made of SiC formed by the epitaxial growth process. The epitaxial growth process may use a process gas including $SiH_4$, $C_3H_8$, $N_2$, and/or $H_2$.

In another embodiment, the filling material film may be made of AlN formed by a physical vapor transport (PVT) process. The physical vapor transport process may use a physical evaporation/condensation process to evaporate a high-purity AlN material.

In another embodiment, the filling material film may be made of AlN formed by an atomic layer deposition process. The atomic layer deposition process may use a process gas including aluminum, $NH_3$, and/or $N_2$, a deposition temperature of about 300° C. to about 800° C., and a deposition pressure of about 0.55 torr to about 50 torr.

In another embodiment, the filling material film may be made of graphene. The process for forming the filling material film may use a process gas including $H_2$, a gas source of carbon, and argon. The gas source of carbon may include methane, acetylene, ethylene, methanol, ethanol, polymethyl methacrylate, polystyrene, and/or polydimethylsiloxane.

In another embodiment, the filling material film may be made of graphene and may be formed by a direct transfer process or a polymethylmethacrylate (PMMA) transfer process.

Referring to FIG. 10, the initial isolation layer 201 may be etched back, to form the isolation layer 204 covering a portion of sidewalls of the first fins 211 (e.g., in Step S814 in FIG. 12).

The initial isolation layer 201 may be etched back by a wet etching process, a dry etching process, or a combination thereof.

In one embodiment, the fin structure may include a plurality of second fins 220, and the initial first fins 210 may be located at least one side of the fin structure. A distance from the sidewalls of each initial first fin 210 to the sidewalls of the adjacent second fin 220 may be a first distance, and a distance between the sidewalls of two adjacent second fins 220 may be a second distance. The first distance may be equal to the second distance. The dry etching process for etching back the initial isolation layer 201 may have a same plasma density on two sides of each second fin 220, and a micro-loading effect in the etching process may be alleviated. Correspondingly, the initial isolation layer 201 on two sides of each second fin 220 may have a same etching rate, and the isolation layer 204 may have a better thickness uniformity. A risk for the device to breakdown due to a difference in the thickness of the isolation layer 201 may be reduced.

In one embodiment, the isolation layer 204 may further cover a portion of the second fins 220.

In one embodiment, the liner oxide layer 202 may be also etched back when etching back the initial isolation layer 201, and the liner oxide layer 202 may have a top surface coplanar with a top surface of the isolation layer 204.

In one embodiment, the initial isolation layer 201 may be etched by a dry etching process. The dry etching process may use a process gas including helium, $NH_3$ and/or $NF_3$; a process pressure of about 2 torr to about 10 torr, and a process time of about 35 seconds to 500 seconds. In the process gas, a helium gas may have a flow rate of about 600 sccm to about 2000 sccm, an $NH_3$ gas may have a flow rate of about 200 sccm to about 500 sccm, and an $NF_3$ gas may have a flow rate of about 20 sccm to about 200 sccm.

In another embodiment, the initial isolation layer 201 may be etched by a diluted hydrofluoric acid (DHF).

In another embodiment, the initial isolation layer 201 may be etched by a Siconi process. The Siconi process may use a gas including $NF_3$ and/or $NH_3$. The Siconi process may include a remote plasma etching process and an in-situ annealing process. In the Siconi process, $NF_3$ and/or $NH_3$ may be transformed to a plasma including $NH_4F$ and/or $NH_4F_2$. The plasma may react with the initial isolation layer 201 to form $(NH_4)SiF_6$. Subsequently, the in-situ annealing process may decompose $(NH_4)SiF_6$ to a gas including $SiF_4$, $NH_3$ and HF. The gas then may be pumped out.

In one embodiment, after etching back the initial isolation layer, the first fins may be etched back. The top surfaces of the first fins may be coplanar with the top surface of the isolation layer.

Referring to FIG. 11, after forming the isolation layer 204, the first fins 211 may be etched back. After etching back the first fins 211, the top surfaces of the first fin may be coplanar with the top surface of the isolation layer 204.

The first fins 211 may be etched back by a wet etching process, a dry etching process, or a combination thereof.

In one embodiment, the first fins 211 may be etched back by an anisotropic dry etching process. The dry etching process may use a process gas including $N_2$, $CHF_3$, $CF_4$ and/or $SO_2$. A $N_2$ gas may have a flow rate of 50 sccm to about 300 sccm; a $CHF_3$ gas may have a flow rate of about 20 sccm to about 500 sccm; a $CF_4$ gas may have a flow rate of about 10 sccm to about 300 sccm; and a $SO_2$ gas may have a flow rate of about 10 sccm to about 200 sccm.

Various embodiments of the present disclosure also provide a FinFET as shown in FIG. 10. In one embodiment, the FinFET may include: a base substrate 200; an isolation layer 204 on the base substrate 200 with first grooves (not shown in the figures); and first fins 211 in the first grooves. A material of the first fins 211 may have a thermal conductivity greater than a thermal conductivity of a material in the base substrate 200.

In one embodiment, the first grooves may have bottom surfaces lower than a top surface of the base substrate, and the first fins 211 may have bottom surfaces lower than the top surface of the base substrate 200.

Materials, dimensions, and structures of the first fins 211 can refer to previous descriptions in the present disclosure. A forming method, dimensions, and structures of the first grooves can refer to the previous description in the present disclosure.

The base substrate 200 may further include a fin structure. The fin structure may include at least one second fin 220, and the first fins 211 may be located on one side or two sides of the fin structure.

In one embodiment, the fin structure may include a plurality of the second fins 220, and the first fins 211 may be located at least on one side of the fin structure. A distance from the sidewalls of each first fin 211 to the sidewalls of the adjacent second fin 220 may be a first distance, and a distance between the sidewalls of two adjacent second fins 220 may be a second distance. The first distance may be equal to the second distance.

Materials, dimensions, and structures of the second fins 220 can refer to previous descriptions in the present disclosure.

A liner oxide layer 202 may be formed between a portion of sidewalls of the first fin 211 and the isolation layer 204. In one embodiment, the liner oxide layer 202 may be further formed between a portion of sidewalls of the second fin 220 and the isolation layer 204, and may be further formed between the isolation layer 204 and the base substrate 200.

The FinFET may further include a mask structure 230 on the top surfaces of the second fins 220.

Materials, dimensions, and structures of the mask structure 230 and the liner oxide layer 202 can refer to previous descriptions in the present disclosure.

The disclosed devices and methods may solve technical problems that conventional methods for forming the FinFETs are more difficult and that the formed FinFETs have poor performances and low reliabilities due to self-heating effects, as the device density increases and critical dimensions of a semiconductor device decrease.

In the present disclosure, the initial first fins may be etched by using the initial isolation layer as a mask, to form the first grooves in the initial isolation layer, and the first fins may be formed in the first grooves. The material of the first fins may have a thermal conductivity greater than a thermal conductivity of the material in the base substrate. When the FinFET works under a voltage, the first fins may improve thermal conductions between the isolation layer and the base substrate. The self-heating effect in the transistor may be alleviated or elminated, and the performance of the semiconductor device may be improved.

Further, the base substrate may be etched after etching the initial first fins. The first grooves may penetrate through the initial isolation layer, and may have the bottom surfaces lower than the top surface of the base substrate. A contacting area between the first fins formed in the first grooves and the base substrate may be adjusted by controlling an etching depth in the base substrate, to enhance the thermal conductions between the isolation layer and the base substrate. The performance of the semiconductor device may be improved.

Further, the fin structure may include a plurality of the second fins. The first fins may be located at least on one side of the fin structure. A distance from the sidewalls of each first fin to a sidewall of the adjacent second fin may be a first distance, and a distance between the sidewalls of adjacent second fins may be a second distance. The first distance may be equal to the second distance. Correspondingly, when etching back the initial isolation layer, a micro-loading effect in the etching process may be alleviated, and the isolation layer may have a better thickness uniformity. A risk for the device to breakdown due to a difference in the thickness of the isolation layer may be reduced.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A FinFET device, comprising:
a base substrate;
an isolation layer on the base substrate;
first fins in the isolation layer and on the base substrate, wherein:
each top surface of the first fins is coplanar with a top surface of the isolation layer, and the first fins is made of a material having a thermal conductivity greater than a material of the base substrate.

2. The device according to claim 1, wherein:
the base substrate further includes a fin structure;
the fin structure includes at least one second fin; and
the first fins are located on at least one side of the fin structure.

3. The device according to claim 2, wherein:
the fin structure includes a plurality of second fins;
the first fins are located at least on one side of the fin structure;
a first distance between a sidewall of the first fin and a sidewall of an adjacent second fin equals to a second distance between the sidewalls of adjacent second fins in the fin structure.

4. The device according to claim 3, further including:
a mask structure on top surfaces of the plurality of second fins.

5. The device according to claim 1, wherein:
the first fins are made of AlN, SiC, graphene, or a combination thereof.

6. A FinFET device, comprising:
a base substrate;
an isolation layer on the base substrate;
first fins in the isolation layer and on the base substrate, wherein:
the first fins is made of a material having a thermal conductivity greater than a material of the base substrate, wherein:
bottom surfaces of the first fins are non-coplanar with a top surface of the base substrate.

7. The device according to claim 6, wherein:
the base substrate further includes a fin structure;
the fin structure includes at least one second fin; and
the first fins are located on at least one side of the fin structure.

8. The device according to claim 7, wherein:
the fin structure includes a plurality of second fins;
the first fins are located at least on one side of the fin structure;
a first distance between a sidewall of the first fin and a sidewall of an adjacent second fin equals to a second distance between the sidewalls of adjacent second fins in the fin structure.

9. The device according to claim 8, further including:
a mask structure on top surfaces of the plurality of second fins.

10. The device according to claim 8, wherein:
the fin structure includes a plurality of first initial fins; and
the first fins are formed directly on the plurality of first initial fins.

11. The device according to claim 10, further including:
a liner oxide layer on sidewalls of the first fins and on sidewalls of the at least one second fin in the fin structure.

12. The device according to claim 11, wherein:
the liner oxide layer completely covers the sidewalls of the first fins and sidewalls of the plurality of first initial fins, and partially covers the sidewalls of the at least one second fin in the fin structure.

13. The device according to claim 10, wherein:
top surfaces of the plurality of second fins are higher than top surfaces of the plurality of first initial fins.

14. A FinFET device, comprising:
a base substrate;
an isolation layer on the base substrate;
first fins in the isolation layer and on the base substrate, wherein:
the first fins are made of a material having a thermal conductivity greater than a material of the base substrate, wherein:
the base substrate further includes a fin structure;
the fin structure includes at least one second fin;
the first fins are located on at least one side of the fin structure;
the fin structure includes a plurality of first initial fins; and
the first fins are formed directly on the plurality of first initial fins.

15. The device according to claim 14, further including:
a liner oxide layer on sidewalls of the first fins and on sidewalls of the at least one second fin in the fin structure.

16. The device according to claim 15, wherein:
the liner oxide layer completely covers the sidewalls of the first fins and sidewalls of the plurality of first initial fins, and partially covers the sidewalls of the at least one second fin in the fin structure.

17. The device according to claim 14, wherein:
top surfaces of the plurality of second fins are higher than top surfaces of the plurality of first initial fins.

18. The device according to claim 14, wherein:
the first fins are made of AlN, SiC, graphene, or a combination thereof.

19. The device according to claim 14, wherein:
top surfaces of the first fins are coplanar with a top surface of the isolation layer.

* * * * *